United States Patent
D'souza et al.

(10) Patent No.: US 9,343,504 B2
(45) Date of Patent: May 17, 2016

(54) LOW CROSS-TALK FOR SMALL PIXEL BARRIER DETECTORS

(71) Applicant: DRS RSTA, Inc., Melbourne, FL (US)

(72) Inventors: Arvind I. D'souza, Anaheim, CA (US);
Mark Muzilla, Riverside, CA (US);
Adrian Ionescu, Long Beach, CA (US)

(73) Assignee: DRS Network & Imaging Systems, LLC, Melbourne, FL (US)

( * ) Notice: Subject to any disclaimer, the term of this patent is extended or adjusted under 35 U.S.C. 154(b) by 0 days.

(21) Appl. No.: 14/213,410

(22) Filed: Mar. 14, 2014

(65) Prior Publication Data

US 2014/0264704 A1 Sep. 18, 2014

Related U.S. Application Data

(60) Provisional application No. 61/784,981, filed on Mar. 14, 2013.

(51) Int. Cl.
*H01L 27/146* (2006.01)
*H01L 27/144* (2006.01)

(52) U.S. Cl.
CPC ...... *H01L 27/14687* (2013.01); *H01L 27/1446* (2013.01); *H01L 27/14694* (2013.01); *H01L 27/1462* (2013.01); *H01L 27/14634* (2013.01); *H01L 27/14636* (2013.01)

(58) Field of Classification Search
CPC ............. H01L 27/14625; H01L 27/14687; H01L 27/1446; H01L 27/14694; H01L 27/14634; H01L 27/14636; H01L 27/1462; H01L 27/14685; H01L 27/14627; H01L 27/14618; H01L 27/14621; H01L 31/0236; H01L 31/052
See application file for complete search history.

(56) References Cited

U.S. PATENT DOCUMENTS

| | | | | |
|---|---|---|---|---|
| 7,928,389 B1 * | 4/2011 | Yap et al. | ............ | 250/338.4 |
| 7,977,637 B1 * | 7/2011 | Yap et al. | ............ | 250/338.4 |
| 2008/0111152 A1 * | 5/2008 | Scott et al. | ............ | 257/188 |
| 2011/0095334 A1 * | 4/2011 | Scott | ............ | 257/188 |
| 2013/0062593 A1 * | 3/2013 | Jones et al. | ............ | 257/21 |
| 2013/0068301 A1 * | 3/2013 | Wang et al. | ............ | 136/258 |

* cited by examiner

*Primary Examiner* — Michelle Mandala
(74) *Attorney, Agent, or Firm* — Kilpatrick Townsend & Stockton LLP

(57) ABSTRACT

Methods and structures of barrier detectors are described. The structure may include an absorber that is at least partially reticulated. The at least partially reticulated absorber may also include an integrated electricity conductivity structure. The structure may include at least two contact regions isolated from one another. The structure may further include a barrier layer disposed between the absorber and at least two contact regions.

15 Claims, 6 Drawing Sheets

LOW CROSS-TALK FOR SMALL PIXEL BARRIER DETECTORS

PRIORITY CLAIM UNDER 35 U.S.C. §119

This application claims the benefit of priority of U.S. Provisional Application No. 61/784,981 filed Mar. 14, 2013, which is herein incorporated by reference in its entirety for all purposes.

TECHNICAL FIELD

The present technology relates to barrier detector processes and equipment. More specifically, the present technology relates to forming barrier detectors with improved functionality.

BACKGROUND

As infrared detector technology continues to develop, new designs can provide vastly improved resolution as compared to technology of the past. Resolution for IR detectors is at least partially determined by the number of pixels in the array. The more pixels in the detector, the more detail may be provided during imaging operations. However, as the number of pixels increases, the size of the detector may similarly grow. Improved technologies have also allowed manufacturing operations to produce pixels of much smaller size in order to maintain certain form factors, while incorporating more pixels to provide the improved resolution.

As pixel pitch is reduced, however, increased cross-talk between pixels may affect resolution, and reduce the modulation transfer function. Additionally, aspects of the detector to reduce dark current may also increase cross-talk between pixels.

Thus, there is a need for improved barrier detectors that can reduce cross-talk compared to conventional designs. These and other needs are addressed by the present technology.

SUMMARY

Methods and structures for barrier detectors are described. The structures may include an absorber that is at least partially reticulated. The at least partially reticulated absorber may also include an integrated electricity conductivity structure. The structure may include at least two contact regions isolated from one another. The structure may further include a barrier layer disposed between the absorber and at least two contact regions.

The barrier layer of the barrier detector may include at least two layers, and the two layers may differ in either bandgap and/or doping. The absorber layer of the barrier detector may include an n-type material and the at least two contact regions may include an n+ or p+-type material. The at least partial reticulation of the absorber may include etching the absorber layer in a region between the at least two contact regions isolated from one another. The at least partial reticulation of the absorber may also include etching the absorber layer to produce a plurality of raised structures.

The absorber integrated electricity conductivity structure may include a doping/bandgap profile within the absorber layer in which the doping of a portion of the absorber adjacent the barrier layer is greater than the doping of a portion of the absorber further from the barrier layer. The absorber integrated electrical conductivity structure may include a transparent conductive material on a surface of the absorber opposite a surface near the barrier layer. The transparent conductive material may include a laser-annealed ion implant. The absorber integrated electricity conductivity structure may include a conductive grid coupled with the detector on the same side of the barrier as the at least two contact regions. The conductive grid may include at least one region penetrating the barrier layer and contacting the absorber.

Methods of forming a barrier detector may include forming an absorber layer over a substrate. The methods may also include forming additional layers overlying the absorber layer. The methods may include removing the substrate from the absorber layer, and may also include at least partially reticulating the absorber layer. The reticulation may include etching the absorber layer between defined pixels such that the absorber may be characterized by a greater width across pixels and a lesser width between pixels. The reticulation may include etching a profile across the absorber layer to form a pattern of raised structures across the surface of the absorber.

The methods may further include adding a dopant to the absorber material during the formation of the absorber layer. The dopant may be added to form a dopant profile within the formed absorber, and the profile may be characterized by a higher dopant concentration in the absorber at a lateral cross-section distal the substrate than at a lateral cross-section proximate the substrate. The methods may also include etching the additional layers overlying the absorber layer to provide access to the absorber layer. The methods may further include coupling a grid with the barrier detector, and the grid may be electrically coupled with the absorber layer. Forming the additional layers overlying the absorber layer may include forming a barrier layer overlying the absorber layer. Forming the barrier layer may include forming at least two layers of material as the barrier layer, and the two layers may differ in either bandgap or doping. The methods may also include attaching the barrier detector to an integrated circuit component.

Such technology may provide numerous benefits over conventional systems and techniques. For example, lower cross-talk between pixels may be afforded by such detectors. An additional advantage is that improved resolution may be realized due to lower cross-talk, and smaller pixel pitch may be utilized based on the improved activity of the detector. These and other embodiments, along with many of their advantages and features, are described in more detail in conjunction with the below description and attached figures.

In the appended figures, similar components and/or features may have the same reference label. Further, various components of the same type may be distinguished by following the reference label with a letter that distinguishes among the similar components. If only the first reference label is used in the specification, the description is applicable to any one of the similar components having the same first reference label irrespective of the letter.

DESCRIPTION

In order to produce infrared detectors with higher resolution, such as short- and mid-wave infrared (SWIR and MWIR) detectors for example, reducing pixel pitch in part provides the potential to show increasingly fine detail. However, as pixel pitch is reduced, crosstalk between pixels may increase, thereby reducing the modulation transfer function (MTF). The MTF generally describes the capability of differentiation between adjacent pixels, and hence the actual capability to show fine detail. As such, when lateral diffusion of electron-hole pairs increases as pixel pitch is reduced, the potential to improve resolution may be defeated by the degradation in MTF.

As pixel pitch continues to decrease, many other compounding factors appear as well. For example, in some SWIR/MWIR detectors it may be important to provide long minority carrier lifetime, as this reduces dark current, or noise, which affects sensitivity of the detector. However, long minority carrier lifetime also may result in long diffusion lengths in the transverse direction, which may further produce high crosstalk. As pixel pitch is reduced, the likelihood of an adjacent pixel collecting a minority carrier generated within a different pixel increases. The present technology provides ways of reducing or preventing crosstalk among pixels of reduced pitch in large arrays, while maintaining relatively long minority carrier lifetimes, to improve overall effectiveness of the detector.

Figure 1:
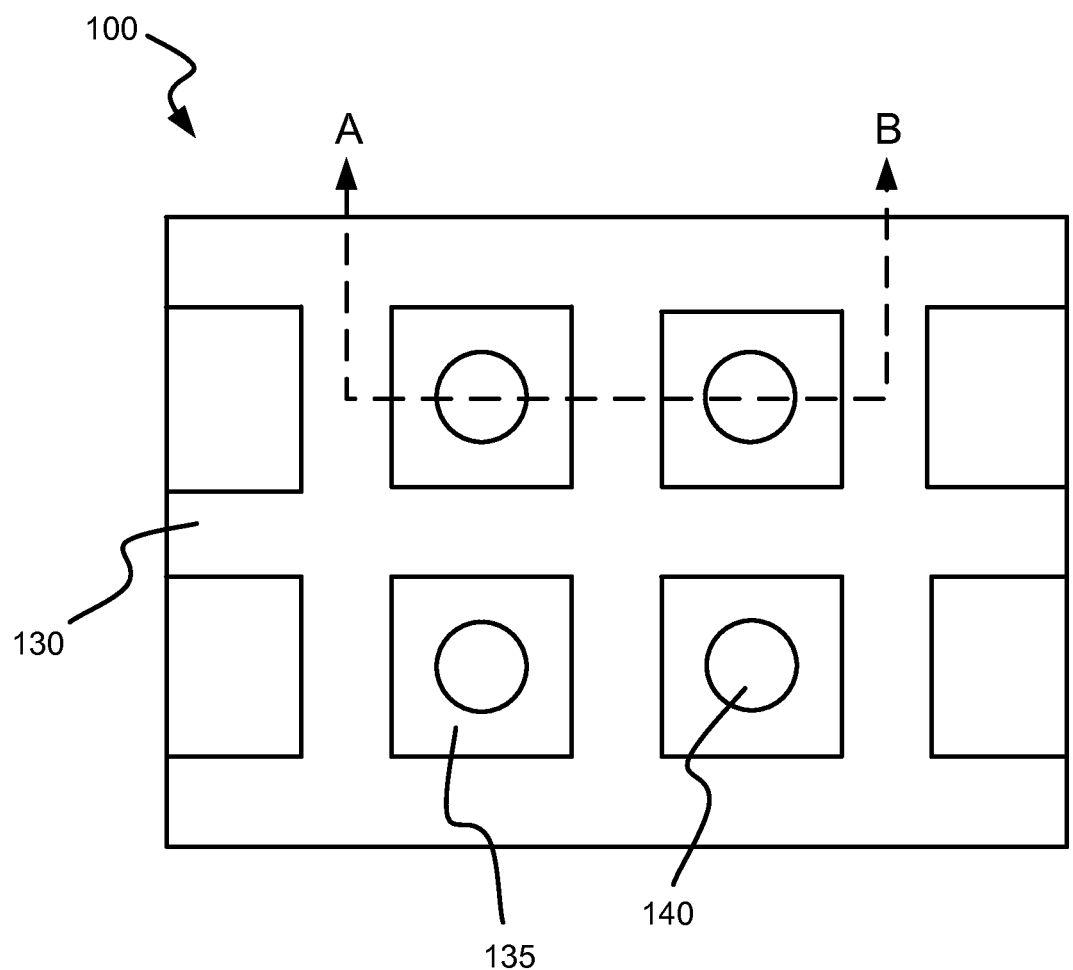
FIG. 1 is a bottom planar view of a portion of an exemplary detector structure made according to embodiments of the present technology.

A bottom planar view of a portion of an exemplary detector structure 100 according to the present technology is shown in FIG. 1. This view relates to the portion of the detector that may be coupled with an integrated circuit (IC) for example, such as a CMOS IC or a ROIC. The structure may include connection material, such as indium bumps 140, overlying the segmented pixel contacts that may be covered by a conductive material such as metallization 135 that may be included to improve communication between the contacts and a connected component, such as an IC component. The contacts may be separated by a dielectric material 130, which may include nitride, oxide, or a similar such material capable of providing electrical separation between the contacts. FIG. 1 may be common for a central region or interior region of an array, and a similar or different configuration may be utilized at external or edge regions of an array. In addition, contact may be made to the absorber layer remotely by removing the dielectric and barrier layer, and having metallization directly contact the absorber layer.

Figure 2A:
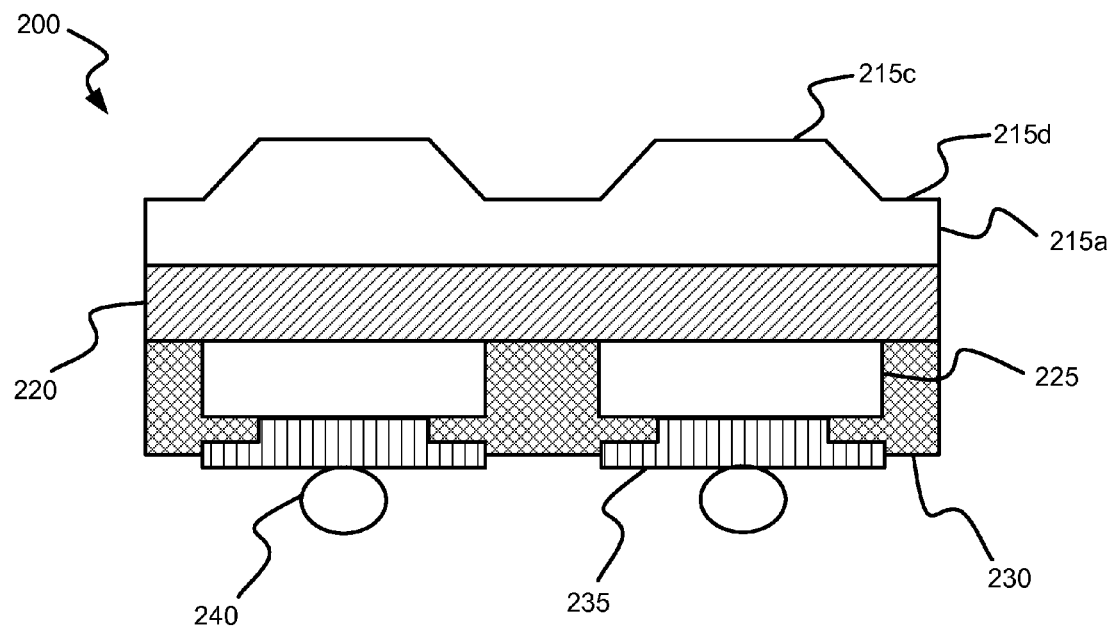
FIG. 2A-2B are exemplary cross-sectional views through line A-B of FIG. 1 according to embodiments of the present technology.
Figure 2B:
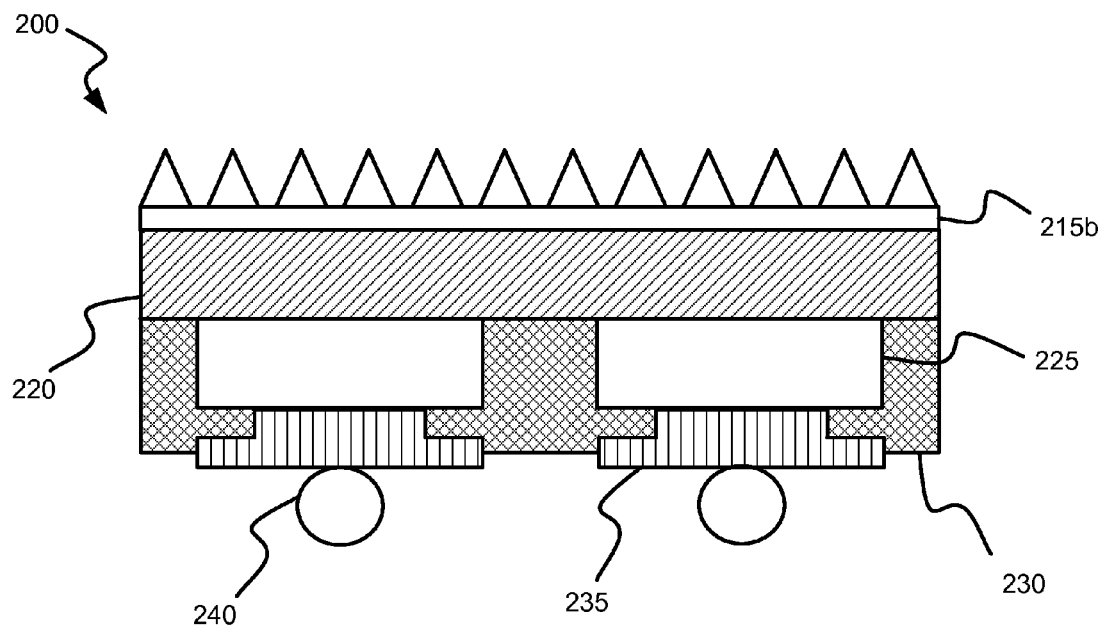

Turning to FIGS. 2A and 2B are cross-sectional views of detector structures 200 through line A-B of FIG. 1 according to embodiments of the present technology. The detector structure may include an absorber layer 215 that is at least partially reticulated, and any number of contact regions 225, such as at least two contact regions 225 that are isolated from one another. A barrier layer 220, which may include a compound barrier, may be disposed between the absorber 215 and the at least two contact regions 225. The absorber 215 may additionally include one or more integrated electricity conductivity structures, as will be described in detail below.

Further components and details may be included as will be described with specific reference to each figure. In FIG. 2A, connection material, such as indium bumps 240, may be included and disposed so as to be in communication with an IC component. Metallization 235 may be included to provide improved connection between the IC component and contacts 225. In an exemplary structure, gold may be disposed between connection material 240 and contacts 225, but any other metal or conductive material suitable for providing electrical contact or improved electrical contact between the components may be used. Although metallization 235 is illustrated in the Figure as being separated with respect to each contact region, in disclosed embodiments the metallization layer may include more or less continuity as may be required.

Contact regions 225 may be sized in relation to required pixel pitch, and may have dimensions less than 50 μm in disclosed embodiments. For example, the contacts may have either lateral dimension or thickness be less than or equal to about 40 μm, 30 μm, 25 μm, 20 μm, 15 μm, 10 μm, 5 μm, 1 μm, 0.5 μm, 0.1 μm, etc. or smaller. The contacts may include an n or p type material, and may be extrinsically doped to be n+ or p+ in disclosed embodiments. For example, the contact material 225 may include $InAs_xSb_{1-x}$, where x is greater than or equal to zero and less than or equal to 1.

A barrier material 220 may be disposed over contacts 225, and may include one or more layers of material. The barrier may include a material such as a large band gap material, and may include multiple materials or different configurations of material used to block the majority carrier. Thus, the structure may include a relatively large discontinuity in the conduction band, and a relatively small or no discontinuity in the valence band, and therefore the minority carriers would be able to flow, and the majority carriers may not. In disclosed embodiments, a compound barrier 220 may be used that provides additional functionality of the barrier. For example, the barrier 220 may include, instead of a single wide band gap material, one or more additional wide band gap layers where each layer may have a different band gap and/or doping associated with it. In this way, the multiple materials may facilitate control of carriers that may accumulate at the edge of the barrier. The barrier material 220 may also be sized according to the required pixel pitch, and in disclosed embodiments, the thickness of the barrier may be less than or equal to about 10 μm, 5 μm, 1 μm, 0.5 μm, 0.1 μm, etc. or less. The barrier may include a variety of materials as would be understood for the barrier material, and may include AlAsSb as one exemplary material. Where multiple barrier layers are used, the materials may include $AlAs_xSb_{1-x}$, where x is greater than or equal to zero and less than or equal to 1. The two layers may include the same or different materials, and for example, the layers may include different x values as noted above for each layer of an otherwise similar material. As such, the barrier may include at least two layers, and each layer may differ in either bandgap or doping.

The top layer, as relative to incident photons or light, may include absorber material 215. In disclosed embodiments, the absorber may have a thickness of less than or about 10 μm, such as less than or about 5 μm for a mid-wave and/or short-wave photo absorber layer. The absorber 215 may include an n or p type material, and may be extrinsically doped in selected regions to be n+ or p+ in disclosed embodiments. Any of a variety of known detector materials may be used that may include a number of elements including indium, germanium, lead, platinum, mercury, lithium, antimony, arsenic, selenium, silicon, cadmium, tellurium, etc., and in one example, the absorber 215 may include $InAs_xSb_{1-x}$, where x is greater than or equal to zero and less than or equal to 1. The absorber 215 material may be selected in conjunction with the contacts 225 in order to affect the function of the cell. For example, the absorber material 215 may include an n-type material, and the at least two contact regions may include an n+-type material. In this situation, the generated electrons will be the majority carriers in the absorber, and the generated holes will be the minority carriers in the absorber. As would be understood, the opposite assignation of electrons and holes would be used for a p-type material used in the absorber.

As shown in the Figures, the absorber 215 may be at least partially reticulated or etched. Barrier detectors, such as those described, may include a common absorber layer across the array of pixels. However, such a configuration may have difficulty with limiting lateral movement of carriers in any lateral direction, which may produce crosstalk. By at least partially reticulating or etching the absorber layer, lateral crosstalk may be at least partially reduced. For example, as shown in FIG. 2A, at least partial reticulation may be performed between defined pixels. For example, the absorber 215a may be etched in a region between the at least two contact regions isolated from one another, which may reduce crosstalk between the pixels. Alternatively, as shown in FIG. 2B, at least partial reticulation may be performed across the entirety of the surface of the absorber 215b that may produce a plurality of raised structures across the surface. In still alternative embodiments, reticulation may not include etching of the structure. In such a case, ion implantation may be performed between pixels to delineate the pixels and impede or prevent minority carrier transmission between adjacent pixels.

Although the features etched for absorber 215b may require more complicated fabrication, and potentially lower throughput, additional advantages may be provided. For example, the features of absorber 215b may be etched so as to maximize absorbance across the entire spectral band. For an exemplary SWIR/MWIR detector, the structures may be etched differently, such as in absorber 215a so as to minimize reflections of wavelengths from roughly 0.5 to 5 μm, and maximize absorbance in that range. Such a profile may create an amount of isolation between the pixels. These structures may surprisingly afford high absorbance even with reduced volume of absorber materials. Additionally, such a configuration may provide advantageously faster throughput and higher device yield. However, reticulation of absorber 215 may produce additional issues.

By increasing the amount of reticulation, the inventors have determined that crosstalk between pixels can be reduced. However, as reticulation increases, the actual conductive region of the absorber is reduced. A certain amount of material may be required to conduct electricity through the layer, or else the voltage may drop and the device may not effectively operate. Accordingly, although full reticulation of the pixels may prevent crosstalk, the device may not provide adequate conduction across the layer to operate. For this reason, an advantageous structure may partially reticulate the absorber, without fully etching to the level of the barrier. Moreover, additional characteristics may be included in the structure to further maintain conductivity across the layer and prevent debiasing, which may occur near full reticulation through the absorber layer. For this reason, the detector structures may additionally include one or more structures integrated with the structure to maintain or enhance electrical conductivity.

An exemplary integrated electricity conductivity structure may include a doping profile across the absorber. For example, a portion of the absorber that may not be reticulated, such as adjacent the barrier layer may have higher doping and corresponding narrower bandgap than a region further from the barrier layer. When a higher doped region is located adjacent the barrier layer, a valence band offset or slope may be introduced which may impede collection of minority carriers. Accordingly, a compensating narrowing of the absorber layer bandgap may be introduced to ensure against valence band barriers and negative gradients. To produce this profile, the doping may be graded continually across the absorber structure, or may have two or more regions of doping. For example, if the absorber includes two regions, such as regions 215c and 215d of absorber 215a, the doping of region 215d adjacent the barrier layer may be greater than the doping of region 215c further from the barrier layer.

By doping or highly doping a portion of the absorber that may be a continuous region of the absorber across the array, electrical conductivity may be maintained even as the continuous region of the absorber is reduced in thickness. Although the additional doping may increase conductivity, a concomitant issue is that the doping may also increase dark current. Accordingly, the absorber material may include a relatively small band of extra doping or conductive coating to minimize dark currents. For example, region 215d that may not be reticulated may only have the extra doping at the region directly adjacent the barrier layer. Across the thickness of the absorber, the doping or conductive coating or additive may only occur at the bottom region, or the region adjacent the barrier. If the absorber 215 is for example, less than or about 10 μm thick or less than or about 5 μm thick, the higher doping may only be performed in the last 25% or less of the thickness of the absorber. The higher doping may also be performed in the last 20% or less of the thickness of the absorber, the last 15% or less, 10% or less, 5% or less, 1% or less, 0.1% or less, etc. In disclosed embodiments, a conductive coating may be applied to the bottom surface of the absorber prior to formation of the barrier layer.

An additional integrated electricity conductivity structure may include a transparent conductive material on a surface of the absorber, such as the surface opposite the surface near or adjacent the barrier layer. For example, as one of the ultimate steps of fabrication, after the reticulation of the absorber 215, a conductive material may be incorporated into or over the absorber. The material may be transparent so as to not affect or limit the effect on the incoming photons. In one example, an ion implant may be performed that embeds ions into the absorber material. These ions may then be annealed to produce the conductive material. Because the operation may occur subsequent to wafer bonding, IC components that may be heat sensitive may be coupled with the array and thus a reduced thermal budget may be a process restriction. In such a circumstance, the implanted ions may be annealed with a laser or similar technology that will not exceed the thermal budget of the coupled IC components.

Figure 3B:
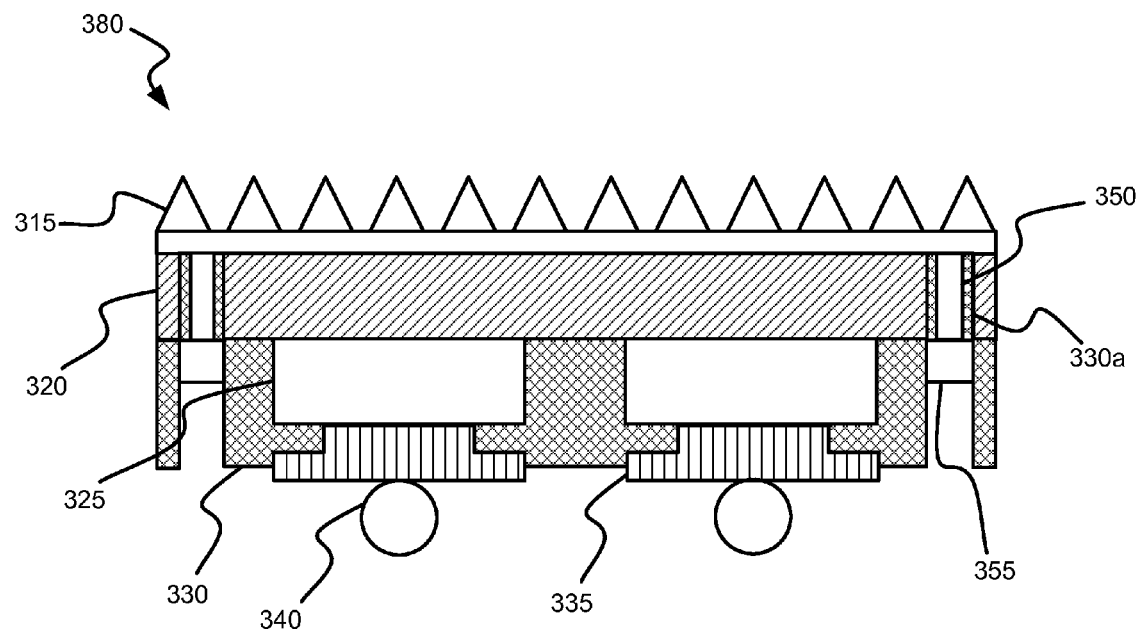
FIG. 3B is an exemplary cross-sectional view through line C-D of FIG. 3A according to embodiments of the present technology.
Figure 3A:
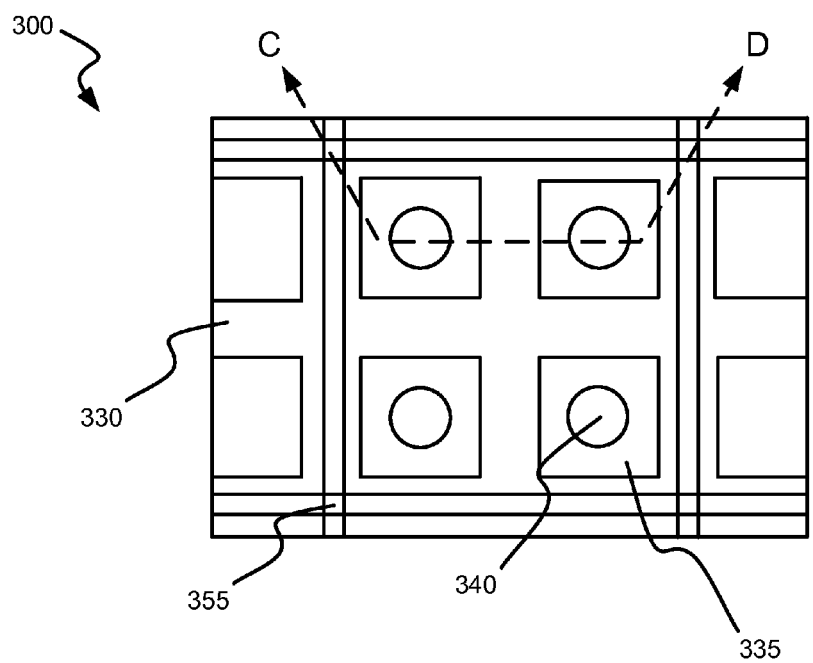
FIG. 3A is a bottom planar view of a portion of an exemplary detector structure made according to embodiments of the present technology.

Still another integrated electricity conductivity structure may include a conductive grid disposed on the detector. The grid may be disposed on the detector on the same side of the barrier layer as the at least two contact regions, as shown in FIGS. 3A and 3B. FIG. 3A shows another bottom planar view of a portion of an exemplary detector structure 300 made according to embodiments of the present technology that may be similar to the detector 100 of FIG. 1 in certain respects. Detector 300 may include bonding material 340, such as indium bumps, disposed over contacts, which may be covered by a conductive material, such as metallization 335. The conductive material may be any conductive material suitable for the process, and may include gold in disclosed embodiments. The contacts may be separated by a dielectric material 330, which may include nitride, oxide, or a similar such material capable of providing electrical separation between the contacts.

The structure may further include conductive bands 355 disposed across the surface of the detector for facilitating electrical conductivity across the detector. The conductive material may or may not be disposed between every pixel, or may bound groups of pixels as shown. A variety of configurations can be used based on the size of the array that minimize the amount of material needed, but provide adequate conductivity across the entire structure to prevent or substantially prevent voltage drops. The conductive material may include a metal such as a conductive metal or non-metal conductive material that may be capable of relatively high electrical conductivity laterally across the array.

FIG. 3B shows an exemplary cross-sectional view of a detector 380 through line C-D of FIG. 3A according to embodiments of the present technology. The structure may include similar components or characteristics as previously discussed with respect to structure 200. The structure may include connection material 340, such as indium bumps or other conductive material, which may be included and disposed so as to be in communication with an IC component of the detector. Metallization 335 may be included to provide improved connection between the IC component and contacts 325. In an exemplary structure, gold may be disposed between connection material 340 and contacts 325, but any other metal or conductive material suitable for providing electrical contact or improved electrical contact between the components may be used. Dielectric material 330, such as oxide or nitride, may be formed or deposited across the surface of the detector to isolate the contacts 325. A barrier material 320, which may include a compound barrier as previously described, may be included between the contact regions 325 and the absorber 315. The absorber 315 may be composed of one of the structures previously discussed including that of absorber 215a or 215b, and may include alternative patterns or configurations as may be required for a particular spectral operation.

Metal grid 355 may be disposed at least partially in line with the contacts 325, and may be disposed on the same side of the barrier 320 as the contacts 325. In order to provide contact for electrical conductivity across the absorber, at least one portion of the grid 355 may penetrate the barrier layer, such as portions 350, in order to provide contact to the absorber 315. The perforations may be included in any variety of configurations as may be required. A portion of the grid may penetrate the barrier to contact the absorber between every pixel, every other pixel, every four pixels, etc., and this may vary depending on the configuration, size of the array, and power needed. Although illustrated in the corner of the pixels at intersecting portions of the grid 355, it is to be understood that the penetrations may occur anywhere along the length of the grid as may provide optimized conductivity and uniformity. As illustrated, an amount of passivation 330a may be included in the portion of the perforated barrier such that the metal grid does not directly contact the barrier 320. As will be discussed further below, the dielectric 330 may be formed after the contact vias are formed in the barrier in order to cover any exposed portion of the barrier from contact with the grid 355.

Figure 4:
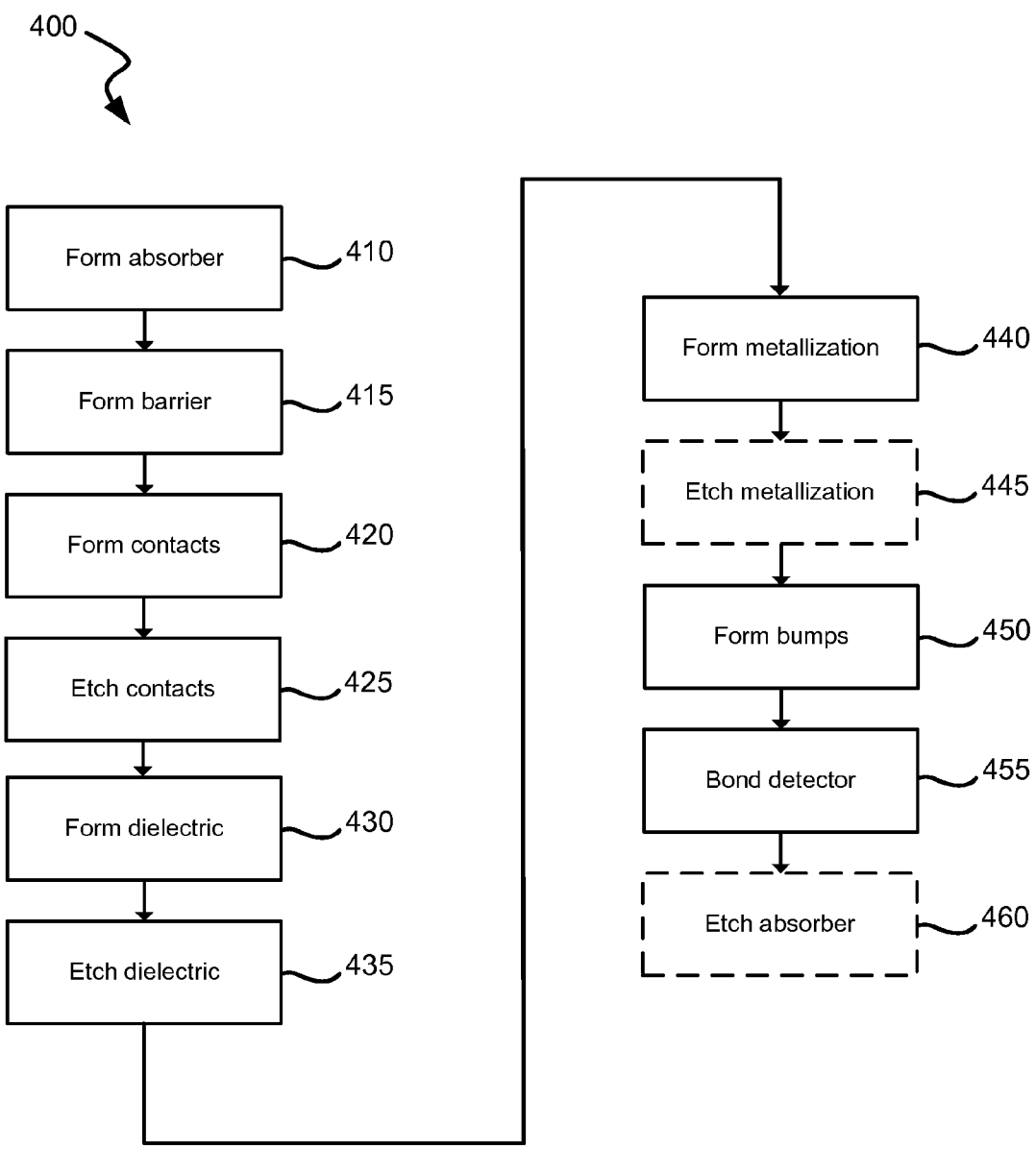
FIG. 4 is a flow chart of an exemplary method of forming a detector structure according to embodiments of the present technology.
Figure 5:
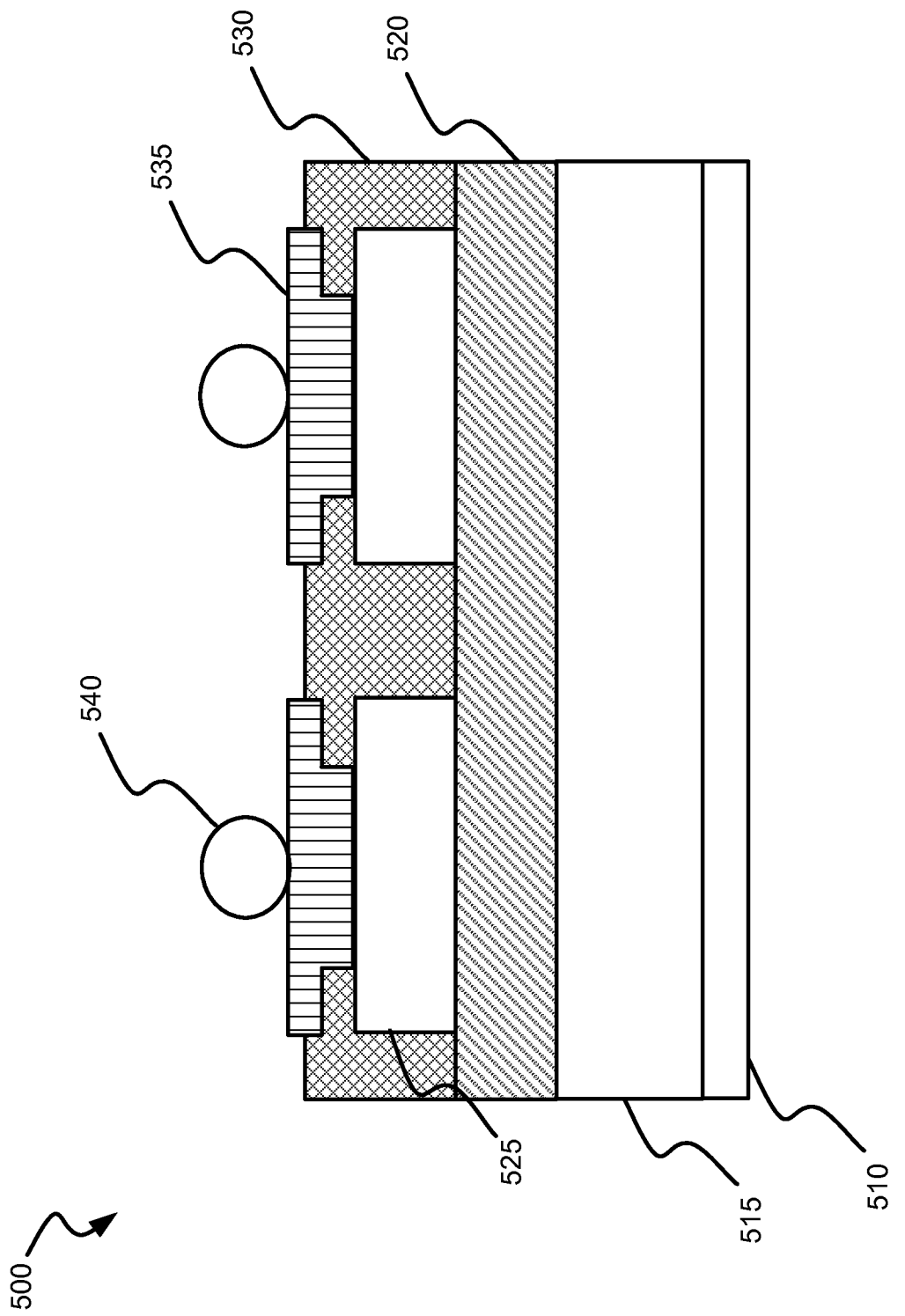
FIG. 5 is a cross-sectional view of another detector structure formed over a substrate according to embodiments of the present technology.

FIG. 4 is a flow chart of an exemplary method of forming a detector structure according to embodiments of the present technology. A cross-sectional view of a detector structure 500 formed over a substrate according to the method of FIG. 4 is shown in FIG. 5. As illustrated, the method may include forming an absorber layer over a substrate at operation 410. As discussed previously, the absorber formation may include adding a dopant to the absorber material and a graded doping or doping profile may be formed if further conductivity is incorporated. A dopant profile may include a higher dopant concentration in the absorber at a lateral cross-section distal the substrate than at a lateral cross-section proximate the substrate. The substrate on which the absorber is formed may be silicon, or alternatively germanium, glass, oxides of Group 14 or Group 15 elements of the periodic table, gallium arsenide, gallium antimonide, alloys of various poor metals and non-metals including silicon and germanium, etc., or other substrates on which microfabrication may be performed. An exemplary detector structure 500, may include absorber 515 formed over substrate 510.

Additional layers of material may be formed overlying the absorber layer in subsequent steps. For example, a barrier layer may be formed overlying the absorber layer at operation 415. A layer of contact material may be formed over the barrier layer at operation 420. Additional doping may be performed if the material is to be extrinsically doped as discussed above. The contacts may be etched to form individual pixels at operation 425, in which at least two contact regions may be formed overlying the barrier layer. As illustrated in FIG. 5, contact layers 525 may be formed and etched subsequent to the formation of barrier layer 520. A dielectric may be deposited over the contacts at operation 430 in order to isolate the contact regions. Subsequent etching may be performed to expose the contact regions for connection at operation 435. A subsequent metallization may be performed at operation 440, in which the contacts are coated in order to improve the contacting for bonding to IC components. As shown in FIG. 5, after the contacts 525 have been isolated, dielectric material 530 such as a nitride may be formed to isolate the individual contacts. After an etching has been performed to expose the contacts, metallization 535, such as gold coating, may be formed over the contacts to improve conductivity.

The metallization 535 may or may not be etched to further isolate the contact regions including the conductive coating at optional operation 445. A bonding material may be formed over the contacts at operation 450, such as forming indium bumps 540 of FIG. 5, or coatings for wafer bonding. Alternatively, the wafer may be directly bonded to an additional structure without these materials. The detector may be coupled with an IC component such as a CMOS IC at operation 455 in order to form the imager array. The substrate may subsequently be removed from the absorber layer to expose the photo detector, and in disclosed embodiments, the absorber may be at least partially reticulated or etched at optional operation 460. The etching may produce an absorber characterized by a greater width across pixels and a lesser width between pixels. Additionally, the etching may form a pattern of raised structures across the absorber. Although etching may be performed, additional isolation of pixels such as ion implanting may be performed either at this stage, or at a prior stage such as subsequent to the deposition of the absorber material. Additional coatings, such as a transparent conductive coating may similarly be performed.

Figure 6:
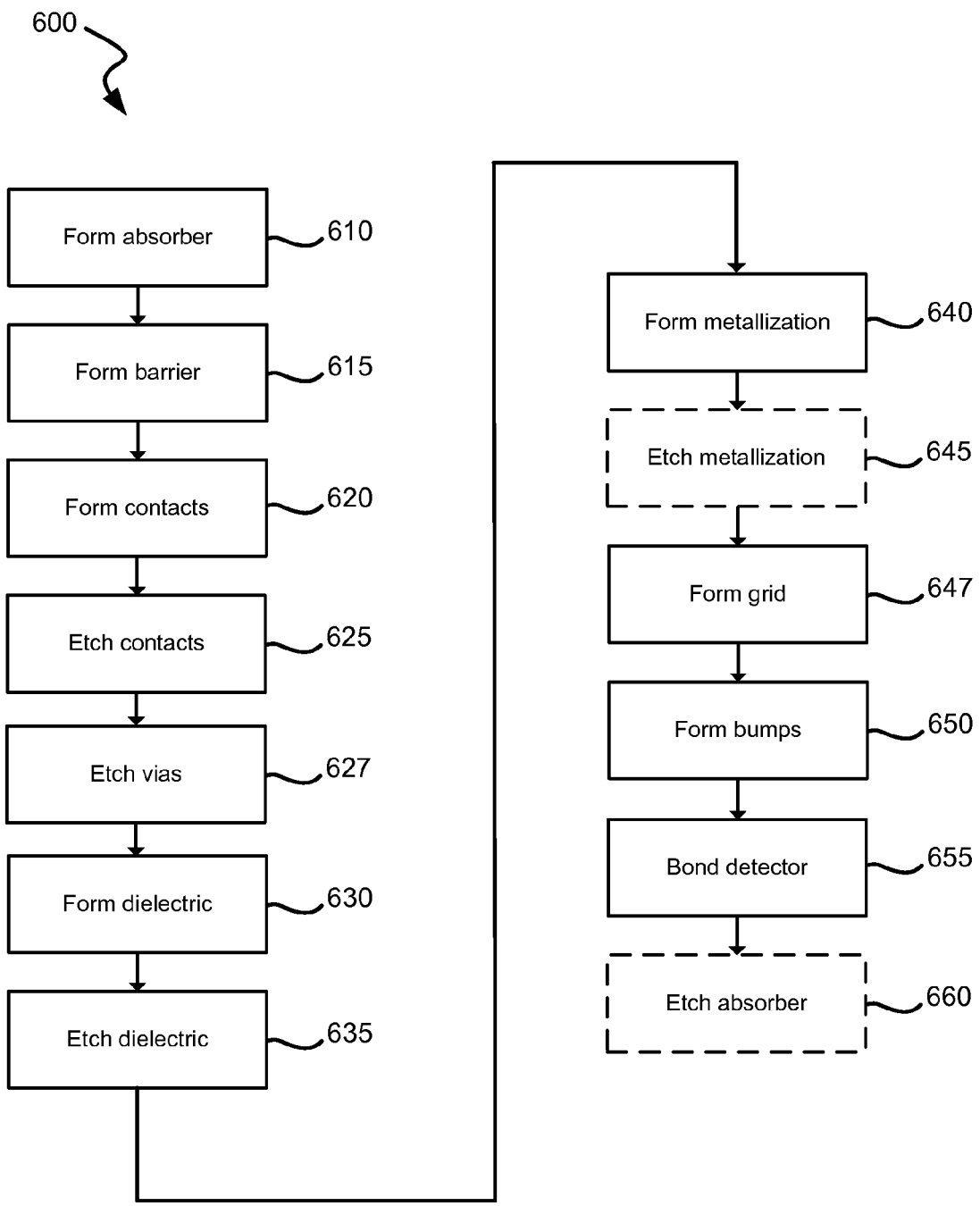
FIG. 6 is a flow chart of an exemplary method of forming a detector structure according to embodiments of the present technology.

Turning to FIG. 6, an additional flow chart of an exemplary method of forming a detector structure according to embodiments of the present technology is shown. Process 600 may include similar operations as discussed with respect to FIG. 4, and may include any of the previously discussed components. An absorber may be formed over a substrate at operation 610, and a barrier or compound barrier may be formed over the absorber at operation 615. The barrier may include one or more layers of material as previously described. A layer of contact material may be formed over the barrier at operation 620, and the contact material may be selected based on the absorber material. For example, if the absorber material is p-type, the contacts may be p+ or n+-type. Additionally, if the absorber is n-type, the contact material may be n+ or p+-type in disclosed embodiments, and additional doping may be performed subsequent to the deposition of the layer of contact material.

The contact material may be etched at operation 625 to form isolated contact regions. Subsequently, vias may be etched into the barrier material at operation 627 to provide contact regions to the absorber material distributed through the array. A dielectric such as a nitride or an oxide may be formed over the structure at operation 630 that may additionally provide a passivation within the barrier layer. The dielectric may be conformally formed within the exposed regions within the barrier to provide isolation of the barrier from subsequent metallization. An additional etching of the dielectric may be performed at operation 635 that may provide access to the absorber layer through the penetrated barrier regions. The etching may be of a lesser degree than the previous etching so as to maintain an amount of dielectric in the barrier such that the barrier may be protected. The etching may additionally expose the contact regions for communication with IC components.

Metallization may be formed at operation 640 in which the contacts are coated as previously described. The metallization may additionally fill the exposed vias in through the barrier layer to provide conductive communication with the absorber layer. The metallization may be optionally etched at operation 645 as may be required during various processing. A conductive grid may be formed over the dielectric layer or coupled with the detector at operation 647 that provides a structure for electrical conductivity across the array. The grid may include metal or other conductive material, and may cover the filled vias such that the grid provides electrical contact to the absorber material through the metallized vias. As previously described, bonding material may be formed over the metallized contacts at operation 650 as required and bonding to IC components may be performed at operation 655. The substrate may subsequently be removed, and the absorber material may be etched, coated, or implanted as previously discussed in order to produce a barrier detector.

Any of the previously described processing steps, as well as additional polishing, annealing, or curing may be performed at temperatures of about 800° C. or less to protect the underlying CMOS IC structure. Alternatively, the processes may be performed at or below about 700° C., 600° C., 500° C., 450° C., 400° C., 350° C., 300° C., 200° C., 150° C., 100° C., etc. or less. The formed layers may have a total height of less than or about 20 µm, which may or may not include the height of connected IC components, to which the barrier detector may be attached. Alternatively, the deposited layers of material, or each material layer, may have a total height of less than or about 10 µm, 7 µm, 5 µm, 3 µm, 2 µm, 1 µm, 800 nm, 750 nm, 600 nm, 500 nm, 450 nm, 400 nm, 350 nm, 300 nm, 250 nm, 200 nm, 150 nm, 100 nm, 50 nm, etc., or less.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present technology. Accordingly, the above description should not be taken as limiting the scope of the technology.

It is noted that individual embodiments may be described as a process which is depicted as a flowchart, a flow diagram, or a block diagram. Although a flowchart may describe the method as a sequential process, many of the operations may be performed in parallel or concurrently. In addition, the order of the operations may be rearranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a dielectric material" includes a plurality of such materials, and reference to "the application" includes reference to one or more applications and equivalents thereof known to those skilled in the art, and so forth.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A method of forming a barrier detector, the method comprising:
    forming an absorber layer over a substrate;
    forming additional layers overlying the absorber layer;
    etching through at least one of the additional layers to access the absorber layer;
    coupling a conductive grid with the accessed absorber layer;
    subsequent to the coupling operation, removing the substrate, over which the absorber layer was formed, from the absorber layer; and
    subsequent to the substrate removal, at least partially reticulating the absorber layer.

2. The method of claim 1, wherein the reticulation comprises etching the absorber layer between defined pixels such that the absorber may be characterized by a greater width across pixels and a lesser width between pixels.

3. The method of claim 1, wherein the reticulation comprises etching a profile across the absorber layer to form a pattern of raised structures across the absorber.

4. The method of claim 1, wherein forming the absorber layer comprises adding a dopant to the absorber material.

5. The method of claim 4, wherein the dopant is added to form a dopant profile within the formed absorber, and wherein the profile comprises a higher dopant concentration in the absorber at a lateral cross-section distal the substrate than at a lateral cross-section proximate the substrate.

6. The method of claim 1, wherein forming additional layers overlying the absorber layer comprises forming a barrier layer overlying the absorber layer.

7. The method of claim 6, wherein forming a barrier layer comprises forming at least two layers of material as the barrier layer, wherein the two layers differ in either bandgap or doping.

8. The method of claim 1, further comprising attaching the barrier detector to an integrated circuit component.

9. A method of forming a barrier detector, the method comprising:
   forming an absorber layer directly overlying a substrate, wherein the absorber layer comprises a first side and a second side opposite the first side, and wherein the absorber layer contacts the substrate on the first side of the absorber layer;
   forming a barrier layer overlying the second side of the absorber layer;
   forming at least one additional layer overlying the barrier layer;
   etching a via through the at least one additional layer and the barrier layer to access the second side of the absorber layer;
   forming a conductive grid through the via, wherein the conductive grid is electrically coupled with the second side of the absorber layer;
   subsequent to the formation of the conductive grid, removing the substrate from the first side of the absorber layer; and
   subsequent to the substrate removal, at least partially reticulating the first side of the absorber layer.

10. The method of claim 9, wherein the conductive grid comprises an extension to access the second side of the absorber layer with the conductive grid.

11. The method of claim 10, further comprising forming a plurality of additional vias through the barrier layer, wherein the conductive grid further comprises a plurality of extensions, and wherein each extension of the plurality of extensions accesses the second side of the absorber layer through one of the plurality of additional vias.

12. The method of claim 9, further comprising passivating the via to electrically insulate the barrier material from the conductive grid.

13. The method of claim 9, wherein forming the barrier layer comprises forming at least two layers of material as the barrier layer, wherein the two layers differ in either bandgap or doping.

14. The method of claim 9, wherein forming the absorber layer comprises adding a dopant to the absorber material.

15. The method of claim 14, wherein the dopant is added to form a dopant profile within the formed absorber, and wherein the profile comprises a higher dopant concentration in the absorber at a lateral cross-section proximate the second side of the absorber than at a lateral cross-section proximate the first side of the absorber.

* * * * *